United States Patent [19]

Bhatla

[11] Patent Number: 5,428,504

[45] Date of Patent: Jun. 27, 1995

[54] COOLING COVER FOR RF POWER DEVICES

[75] Inventor: Ravinder N. Bhatla, Hurst, Tex.

[73] Assignee: Motorola, Inc., Schaumburg, Ill.

[21] Appl. No.: 44,889

[22] Filed: Apr. 9, 1993

Related U.S. Application Data

[63] Continuation of Ser. No. 835,816, Feb. 18, 1992, abandoned.

[51] Int. Cl.⁶ ............................................... H05K 1/18
[52] U.S. Cl. .................................... 361/762; 361/704; 361/763; 361/807; 174/16.3; 165/185; 257/720
[58] Field of Search .................... 361/380, 386–389, 361/400, 403, 415, 421, 679, 704, 702, 703, 707, 708, 760, 761, 762, 763, 766, 771, 796, 807, 813; 257/722, 720; 174/16.3; 165/80.3, 185

[56] References Cited

U.S. PATENT DOCUMENTS

| | | | |
|---|---|---|---|
| 4,396,939 | 8/1983 | McIver et al. | 357/81 |
| 4,554,613 | 11/1985 | Kaufman | 361/386 |
| 4,607,276 | 8/1986 | Butt | 357/79 |
| 4,724,514 | 2/1988 | Kaufman | 361/388 |
| 4,758,927 | 7/1988 | Berg | 361/401 |
| 5,057,909 | 10/1991 | Mok et al. | 357/81 |
| 5,113,315 | 5/1992 | Capp et al. | 361/386 |

Primary Examiner—Leo P. Picard
Assistant Examiner—Young Whang
Attorney, Agent, or Firm—Kevin A. Buford

[57] ABSTRACT

A cooling cover for an RF power amplifier device having a mounting support, a first lead, and a heat generating die mounted on the first lead. The cooling cover is comprised of a body of a thermally conductive material and having a first surface and a second surface. A layer of thermally conductive and electrical non-conductive material is deposited upon the second surface of the cooling cover. When the cover is coupled to the mounting support, the first surface is in contact with the mounting support and the second surface is in contact with the first lead thereby providing a low resistance heat path between the heat generating die and mounting support.

28 Claims, 4 Drawing Sheets

COOLING COVER FOR RF POWER DEVICES

This is a continuation of application Ser. No. 07/835,816, filed Feb. 18, 1992 and now abandoned.

FIELD OF THE INVENTION

The field of this invention relates to the cooling of power devices and, in specific, to the cooling of RF power amplifiers.

BACKGROUND OF THE INVENTION

RF power amplifiers (RF PAs), are well known in the art. Such devices may be fabricated in the form of a single discrete device containing a single amplification device (e.g. a transistor die) and associated compensation devices (e.g. a MOS capacitor) (FIGS. 1 and 2).

Within the RF PA, an RF power amplifier die (10) is, typically, mounted to a metal (e.g. gold plated kovar or tin plated copper) collector lead (11) which is, in turn, mounted to an electrically non-conductive beryllium oxide (BeO) pedestal (16). The BeO pedestal, in turn, supports a base lead (12), and an emitter lead (13) which are wire-bonded to the die. The BeO pedestal may, in turn, be attached to a heat conductive, mounting support (14). The support (14), together with a cover (15), encloses the die and wire-bonds; and between which the collector, emitter and base leads project, provides an RF PA enclosure.

Cooling of the die occurs primarily through transfer of heat from the die into the metal leads (the lead frame) (11, 12, and 13). Cooling of the lead frame (11, 12, and 13), in turn, occurs through conduction into the pedestal (16). Heat passing into the pedestal is then re-transmitted into the mounting support (14) and, consequently, into a heat sink (not shown).

The cover enclosing the die also conducts a small amount of heat from the die, convectively, into the surrounding air. However, because the cover is in contact with the lead frame, it is typically constructed of an electrically non-conductive material, such as alumina ($Al_2O_3$). Use of an alumina cover results in a poor rate of heat transfer through the cover (the thermal conductivity of alumina is 15–20 W/m°K.). Because of the poor rate of heat transfer of alumina, the prior art alumina covers may be regarded as non-conductive in terms of heat transfer from collector lead to support (14).

The pedestal (16), through which most of the heat from the die passes, has a fairly high rate of thermal conductivity (230–260 W/m°K.). During periods of continuous transmission, on the other hand, the rate of heat transfer through the pedestal (16) may not match the rate of thermal output of the die (10). The die (10) and collector lead (11), in such cases, may overheat and cause damage to the die (10) or to associated solder joints.

Past efforts at improving cooling of RF PAs have included attachment of fins or heat sinks to the collector lead external (11) to the RF PA enclosure. While these efforts have provided some protection from some types of short term overload, damage may still occur during periods of continuous transmission. Because of the importance of RF PAs a need exists for improved methods of cooling RF PAs.

SUMMARY OF THE INVENTION

A cooling cover for an RF power amplifier device having a mounting support, a first lead, and a die mounted on said first lead. The cover is comprised of a body composed of a thermally conductive material and having a first surface and a second surface. A layer of thermally conductive material and electrical non-conductive material is deposited upon said second surface such that when coupled to said mounting support, said first surface is in contact with said mounting support and said second surface is in contact with said first lead.

DETAILED DESCRIPTION OF THE PREFERRED EMBODIMENT

The solution to the problem of die cooling of an RF PA lies, conceptually, in fabricating a thermally conductive device cover of a material with a relatively high rate of thermal conductivity and placing the cover in contact with a first/collector lead and mounting support. Use of a thermally conductive cover may allow significant amounts of heat to be beneficially transmitted through the cover, from the first lead to the mounting support, in parallel with heat flow through the pedestal.

Figure 3A:
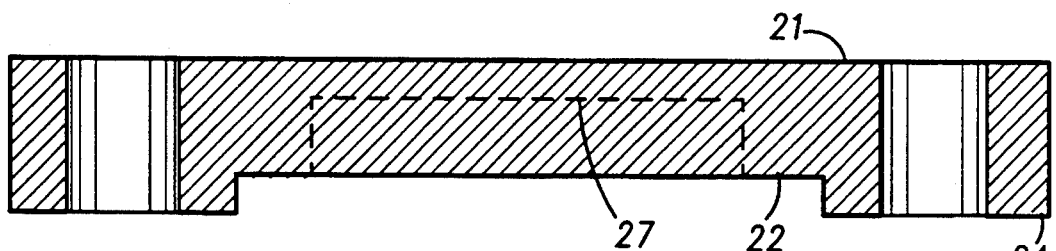
FIG. 3 depicts the thermally conductive cover in accordance with the invention.
Figure 3B:
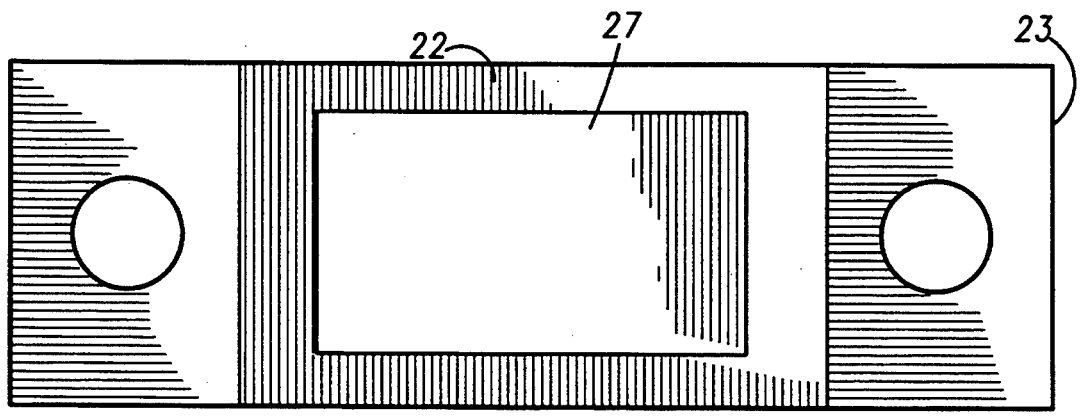
Figure 4:
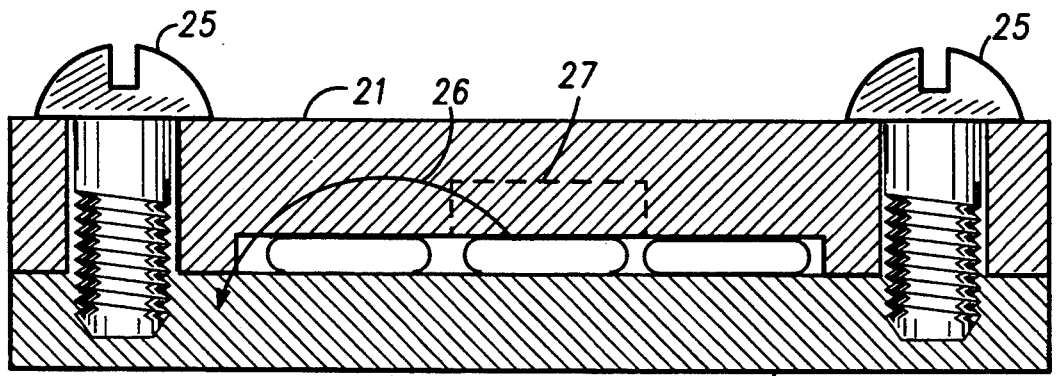
FIG. 4 depicts a thermally conductive cover attached to a support structure of an RF power amplifier.
Figure 5:
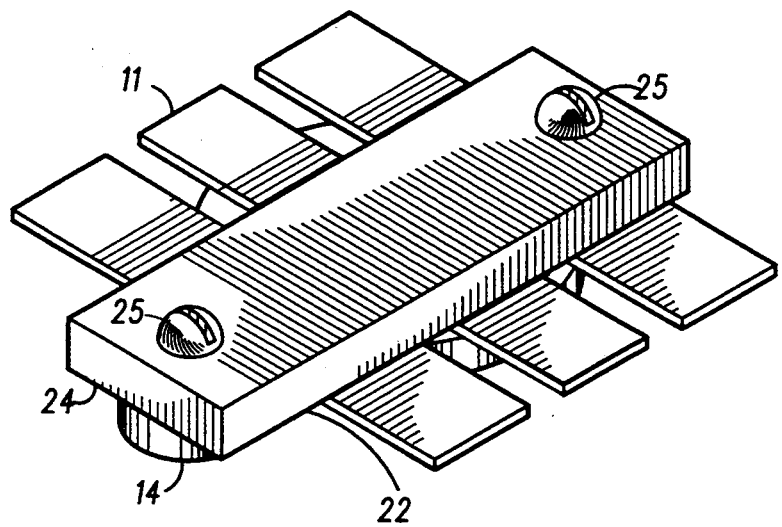
FIG. 5 comprises a perspective view of the heat conductive cover attached to a support structure of an RF power amplifier.

Shown in FIGS. 3 and 4, generally, is a thermally conductive device cover (20) having a cavity (27) in accordance with the invention. The cover (20) includes two primary heat-transfer surfaces including a first, mounting support surface (24), and a second surface (22) and may include cavity 27. The mounting support surface (24) may be held in intimate contact with the mounting support (14) of the RF PA enclosing the cavity (27) through the use of screws (25). The screws (25) may also hold the second surface (22), in intimate contact with the collector (11).

The thermally conductive cover (20) is comprised of two materials. The first material, of which the conductive cover (20) is constructed, is copper (21). However, any similar conductive material may be substituted. A thin layer (e.g. 0.030") of a second material having a relatively high rate of thermal conductivity and a low rate of electrical conductivity is deposited on the second surface, creating a collector surface (22).

The collector surface (22) is deposited where the cover (20) contacts the collector, emitter, and base. The collector surface (22) provides electrical isolation among the collector, emitter, base.

The conductive cover (20) serves to provide a low resistance heat-flow path between the collector (11) and the mounting support (14). The relatively high rate of heat flow may be provided by the substantially copper construction of the conductive cover (20) and the high rate of thermal conductivity of copper (390 W/m°K.). The thin layer (22) of aluminum nitride although providing a lower rate of thermal conductivity (120-190 W/m°K.), still offers a heat path (26) of significantly less thermal resistance than that offered by the prior art, alumina cover.

In one embodiment of the invention the cover (20) is constructed to attach to the mounting support (14) by means of screws passing through the mounting support. Under such an embodiment the screws bias the cover (20) into intimate contact with the mounting support (14) and collector (11). In another embodiment of the invention the collector surface (22) of the cover (20) may be selectively soldered to the collector lead (11).

Figure 1:
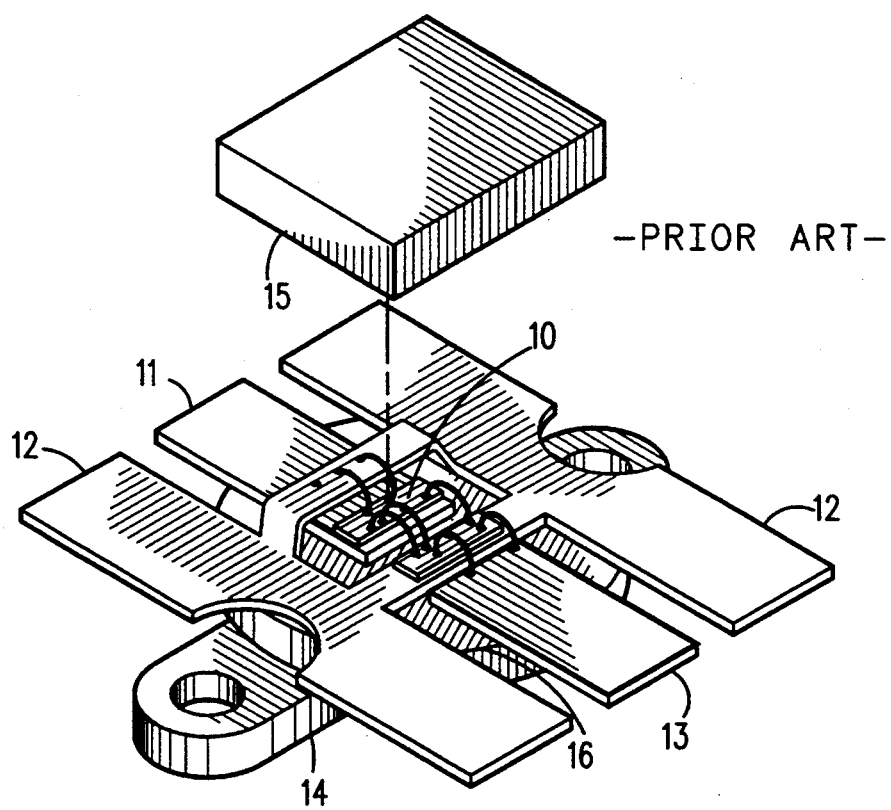
FIG. 1 comprises a perspective view of an RF power amplifier under the prior art showing the die, collector, emitter, base, and support structure.
Figure 2:
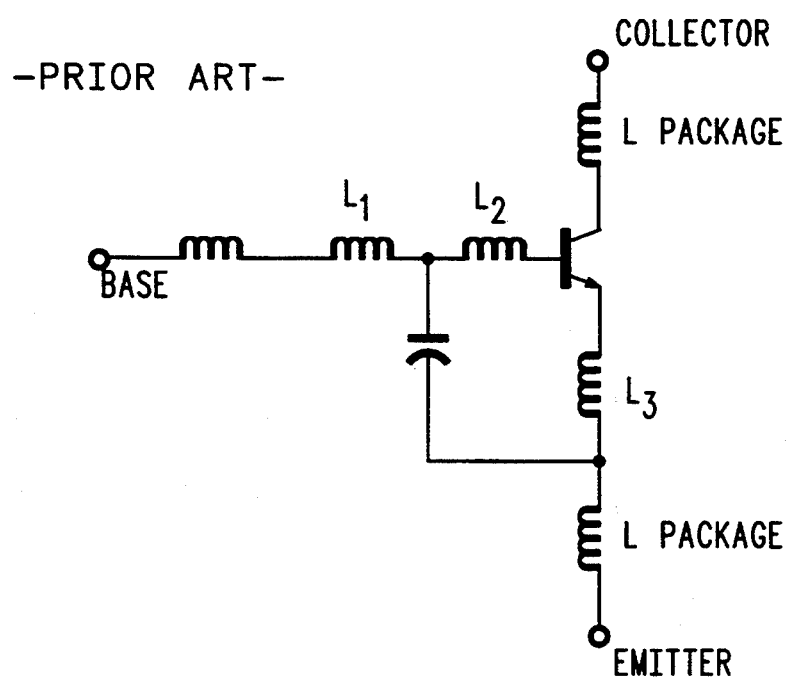
FIG. 2 comprises a schematic of a prior art RF power amplifier.
Figure 6:
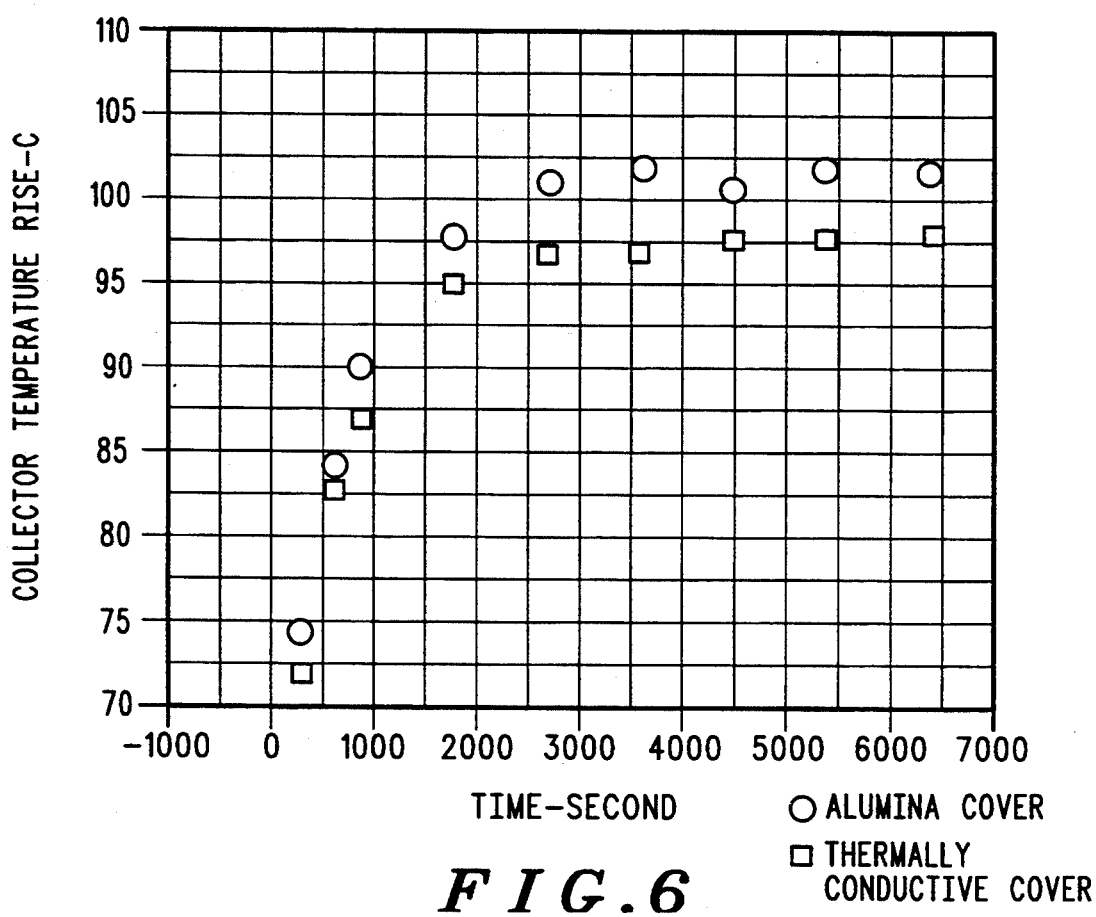
FIG. 6 comprises comparative test data of the inventive thermally conductive RF PA cover.

Shown in FIG. 6 is a collector lead temperature versus time comparison between a prior art, alumina cover and the thermally conductive cover (20). Data for the time v. temperature curves (FIG. 2) were generated through testing of a MRF847 RF PA available from Motorola, Inc. The data for such curves was generated, first, with an alumina cover. Following completion of such tests the alumina cover was removed and replaced, and the tests repeated, with a cover (20) constructed in accordance with the invention. As may be verified by reference to FIG. 6 an average collector lead temperature improvement of from 5°-10° C. is provided through use of the thermally conductive cover (20) over the alumina cover.

Figure 7:
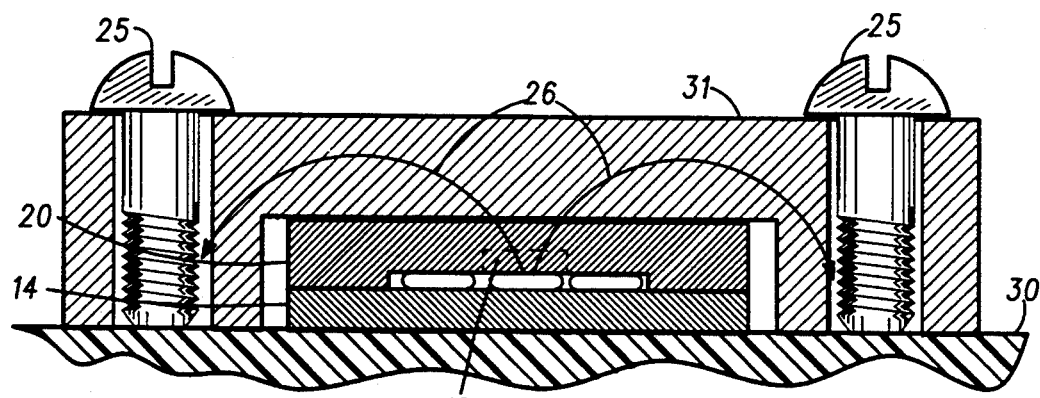
FIG. 7 depicts a heat sink cover attached to a support structure of an RF power amplifier.

In another embodiment of the invention a heat sink cover (31, FIG. 7)) is clamped over the cooling cover (20) and mounting support (14) by mounting screws (25). Under such an embodiment heat (26) from the die (10) flows from the cooling cover (20) into the heat sink cover (31) and directly into the heat sink (30).

Figure 8:
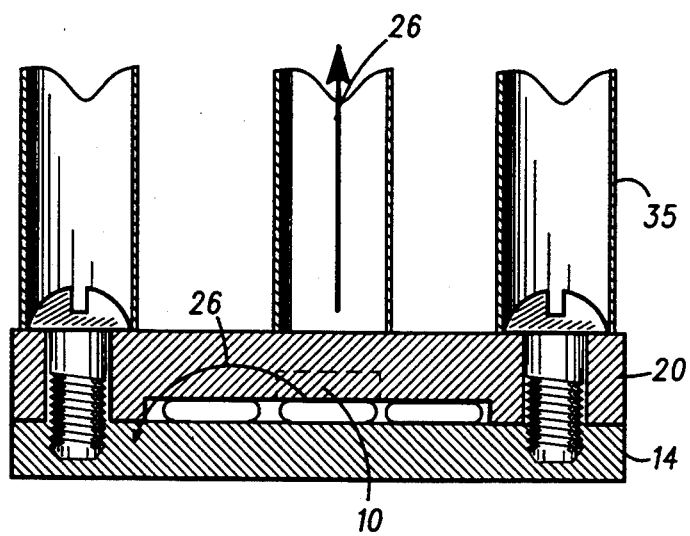
FIG. 8 depicts cooling fins attached to a support structure of an RF power amplifier.

In another embodiment of the invention cooling fins (35, FIG. 8) are installed on the top of the cooling cover (20). Under such an embodiment heat (26) from the die (10) may be dissapated through conduction into cooling fins (35) as well as through conduction through the cover (20) into the heat sink.

I claim:

1. A cooling cover for an radio frequency RF power amplifier device having a mounting support, a first lead, and a die mounted on said first lead, said cover comprising:
   A) a body composed of a thermally conductive material and having a first surface and a second surface; and
   B) a layer of thermally conductive and electrically non-conductive material deposited upon said second surface such that when the cover is coupled between said mounting support and first lead, said first surface is in thermally conductive contact with said mounting support and said second surface is in thermally conductive and electrically non-conductive contact with said first lead via said layer.

2. The apparatus as in claim 1 wherein the thermally conductive body is comprised of copper.

3. The apparatus as in claim 1 wherein the thermally conductive layer is comprised of aluminum nitride.

4. The apparatus as in claim 1 further comprising a heat sink cover contacting the cooling cover and a heat sink.

5. The apparatus as in claim 1 wherein the cooling cover further comprises cooling fins.

6. A method of cooling a lead of an RF power amplifier device having a mounting support and an amplifier die mounted on the lead, such method comprising the steps of:
   A) providing a device cover, having a mounting support surface and a second surface, of a material having a relatively high rate of thermal conductivity;
   B) depositing, along the second surface of the cover, a relatively thin layer of a material having a relatively high rate of thermal conductivity and low rate of electrical conductivity, thereby creating a lead surface; and,
   C) attaching the mounting support surface to the mounting support and the lead surface to the lead thereby cooling the lead.

7. The method as in claim 6 wherein the step of fabricating the device cover further includes the step of selecting copper as the material having the relatively high rate of thermal conductivity.

8. The method as in claim 6 wherein the step of depositing the relatively thin layer further includes the step of selecting aluminum nitride as the material having the relatively high rate of thermal conductivity and low rate of electrical conductivity.

9. The method as in claim 6 wherein the step of attaching the cover to the mounting support and lead further includes the step of enclosing the amplifier die within the cover and mounting support of the RF power amplifier.

10. The method as in claim 6 wherein the step of fabricating the device cover further includes the step of orienting the mounting support surface and second surface in the same plane.

11. The method of claim 6 wherein the step of attaching the lead surface to the lead comprises soldering the lead surface to the lead.

12. A apparatus for cooling a lead of an RF power amplifier device having a mounting support and an amplifier die mounted on the lead, the apparatus comprising:
   A) a device cover, having a mounting support surface and a second surface, of a material having a relatively high rate of thermal conductivity;
   B) a relatively thin layer of a material having a relatively high rate of thermal conductivity and low rate of electrical conductivity deposited along the second surface of the cover thereby creating a lead surface; and,
   C) means for attaching the mounting support surface to the mounting support and the lead surface to the lead.

13. The apparatus in claim 12 wherein the lead comprises a collector lead.

14. The apparatus as in claim 12 wherein the device cover is comprised of copper.

15. The apparatus as in claim 12 wherein the relatively thin layer is comprised of aluminum nitride.

16. The apparatus as in claim 12 wherein the means for attaching the mounting support surface to the mounting support is comprised of screws.

17. The apparatus as in claim 12 wherein the means for attaching the lead surface to the collector is comprised of screws.

18. The apparatus as in claim 12 wherein the means for attaching the collector surface to the collector is comprised of solder.

19. An apparatus for cooling a die of a radio frequency power amplifier, such apparatus comprising in combination: the die disposed on a first side of a first end of an electrically conductive lead: a metallic cover substantially covering the first side of the first end of the conductive lead and the die; and a layer of aluminum nitride of a thickness of substantially 0.030 inches disposed between the first lead and thermally conductive cover.

20. The apparatus of claim 19 wherein the electrically conductive lead is comprised of copper.

21. The apparatus of claim 19 further comprising cooling fins disposed on an outside surface of the metallic cover.

22. A method of cooling a die of a radio frequency power amplifier comprising the steps of: disposing the die on a first side of a first end of an electrically conductive lead: substantially covering the first side of the first end of the conductive lead and the die with a thermally conductive cover; and electrically isolating the first end of the electrically conductive lead from the thermally conductive cover by disposing a thermally conductive, electrically non-conductive material between the first lead and thermally conductive cover.

23. The method of claim 22 further comprising the step of defining the thermally conductive, electrically non-conductive material as aluminum nitride.

24. The method of claim 22 further comprising the step of disposing cooling fins on an outside surface of the thermally conductive cover.

25. A power amplifier assembly including a power amplifier having at least a first electrical lead a cover and a mounting support, wherein the cover assembly comprises a thermally conductive body having a first and second surface and a electrically non-conductive thermal conductor layer deposited on the second surface, and wherein the layer is metallically attached to the first lead and the first surface is coupled to the mounting support such that the cover forms an electrically non-conductive thermal conductor between the first lead and mounting support.

26. The assembly of claim 25 wherein the layer is comprised of aluminum nitride.

27. The assembly of claim 25 wherein the layer is metallically attached to the first lead by solder.

28. The assembly of claim 25 wherein the body is comprised of copper.

* * * * *